United States Patent
Mauer et al.

(10) Patent No.: US 8,386,550 B1
(45) Date of Patent: Feb. 26, 2013

(54) METHOD FOR CONFIGURING A FINITE IMPULSE RESPONSE FILTER IN A PROGRAMMABLE LOGIC DEVICE

(75) Inventors: Volker Mauer, High Wycombe (GB); Suleyman Sirri Demirsoy, London (GB)

(73) Assignee: Altera Corporation, San Jose, CA (US)

( * ) Notice: Subject to any disclaimer, the term of this patent is extended or adjusted under 35 U.S.C. 154(b) by 817 days.

(21) Appl. No.: 11/533,482

(22) Filed: Sep. 20, 2006

(51) Int. Cl.
   *G06F 17/10* (2006.01)
(52) U.S. Cl. .................................. 708/301; 708/319
(58) Field of Classification Search .......... 708/300–303, 708/313
   See application file for complete search history.

(56) References Cited

U.S. PATENT DOCUMENTS

| | | |
|---|---|---|
| 3,473,160 A | 10/1969 | Wahlstrom |
| 3,800,130 A | 3/1974 | Martinson et al. |
| 3,814,924 A | 6/1974 | Tate |
| 4,156,927 A | 5/1979 | McElroy et al. |
| 4,179,746 A | 12/1979 | Tubbs |
| 4,212,076 A | 7/1980 | Conners |
| 4,215,406 A | 7/1980 | Gomola et al. |
| 4,215,407 A | 7/1980 | Gomola et al. |
| 4,422,155 A | 12/1983 | Amir et al. |
| 4,484,259 A | 11/1984 | Palmer et al. |
| 4,521,907 A | 6/1985 | Amir et al. |
| 4,575,812 A | 3/1986 | Kloker et al. |
| 4,597,053 A | 6/1986 | Chamberlin |
| 4,616,330 A | 10/1986 | Betz |
| 4,623,961 A | 11/1986 | Mackiewicz |
| 4,682,302 A | 7/1987 | Williams |
| 4,718,057 A | 1/1988 | Venkitakrishnan et al. |
| 4,727,508 A | 2/1988 | Williams |
| 4,736,335 A | 4/1988 | Barkan |
| 4,754,421 A | 6/1988 | Bosshart |
| 4,791,590 A | 12/1988 | Ku et al. |
| 4,799,004 A | 1/1989 | Mori |
| 4,823,295 A | 4/1989 | Mader |
| 4,839,847 A | 6/1989 | Laprade |
| 4,871,930 A | 10/1989 | Wong et al. |
| 4,912,345 A | 3/1990 | Steele et al. |

(Continued)

FOREIGN PATENT DOCUMENTS

| | | |
|---|---|---|
| EP | 0 158 430 | 10/1985 |
| EP | 0 326 415 | 8/1989 |

(Continued)

OTHER PUBLICATIONS

Altera Corporation, "Digital Signal Processing (DSP)," *Stratix Device Handbook*, vol. 2, Chapter 6 and Chapter 7, v1.1 (Sep. 2004).

(Continued)

*Primary Examiner* — Chat Do
*Assistant Examiner* — Matthew Sandifer
(74) *Attorney, Agent, or Firm* — Ropes & Gray LLP; Jeffrey H. Ingerman

(57) ABSTRACT

A hybrid FIR filter includes a plurality of FIR filter units arranged as Direct Form FIR filters, connected together in an arrangement similar to a Transpose Form FIR filter. The hybrid filter arrangement may be used to configure a larger FIR filter in a programmable logic device having one or more specialized functional blocks, incorporating multipliers and adders, that are particularly well-suited for configuration as small Direct Form FIR filters.

12 Claims, 5 Drawing Sheets

U.S. PATENT DOCUMENTS

| | | |
|---|---|---|
| 4,918,637 A | 4/1990 | Morton |
| 4,967,160 A | 10/1990 | Quievy et al. |
| 4,982,354 A | 1/1991 | Takeuchi et al. |
| 4,991,010 A | 2/1991 | Hailey et al. |
| 4,994,997 A | 2/1991 | Martin et al. |
| 5,068,813 A | 11/1991 | Thoen |
| 5,073,863 A | 12/1991 | Zhang |
| 5,081,604 A | 1/1992 | Tanaka |
| 5,122,685 A | 6/1992 | Chan et al. |
| 5,128,559 A | 7/1992 | Steele |
| 5,175,702 A | 12/1992 | Beraud et al. |
| 5,208,491 A | 5/1993 | Ebeling et al. |
| RE34,363 E | 8/1993 | Freeman |
| 5,267,187 A | 11/1993 | Hsieh et al. |
| 5,296,759 A | 3/1994 | Sutherland et al. |
| 5,338,983 A | 8/1994 | Agarwala |
| 5,339,263 A | 8/1994 | White |
| 5,349,250 A | 9/1994 | New |
| 5,357,152 A | 10/1994 | Jennings, III et al. |
| 5,371,422 A | 12/1994 | Patel et al. |
| 5,375,079 A | 12/1994 | Uramoto et al. |
| 5,381,357 A | 1/1995 | Wedgwood et al. |
| 5,404,324 A | 4/1995 | Colon-Bonet |
| 5,424,589 A | 6/1995 | Dobbelaere et al. |
| 5,446,651 A | 8/1995 | Moyse et al. |
| 5,451,948 A | 9/1995 | Jekel |
| 5,452,231 A | 9/1995 | Butts et al. |
| 5,452,375 A | 9/1995 | Rousseau et al. |
| 5,457,644 A | 10/1995 | McCollum |
| 5,465,226 A | 11/1995 | Goto |
| 5,465,375 A | 11/1995 | Thepaut et al. |
| 5,483,178 A | 1/1996 | Costello et al. |
| 5,497,498 A | 3/1996 | Taylor |
| 5,500,812 A | 3/1996 | Saishi et al. |
| 5,500,828 A | 3/1996 | Doddington et al. |
| 5,523,963 A | 6/1996 | Hsieh et al. |
| 5,528,550 A | 6/1996 | Pawate et al. |
| 5,537,601 A | 7/1996 | Kimura et al. |
| 5,541,864 A | 7/1996 | Van Bavel et al. |
| 5,546,018 A | 8/1996 | New et al. |
| 5,550,993 A | 8/1996 | Ehlig et al. |
| 5,559,450 A | 9/1996 | Ngai et al. |
| 5,563,526 A | 10/1996 | Hastings et al. |
| 5,563,819 A | 10/1996 | Nelson |
| 5,570,039 A | 10/1996 | Oswald et al. |
| 5,570,040 A | 10/1996 | Lytle et al. |
| 5,572,148 A | 11/1996 | Lytle et al. |
| 5,581,501 A | 12/1996 | Sansbury et al. |
| 5,590,350 A | 12/1996 | Guttag et al. |
| 5,594,366 A | 1/1997 | Khong et al. |
| 5,594,912 A | 1/1997 | Brueckmann et al. |
| 5,596,763 A | 1/1997 | Guttag et al. |
| 5,606,266 A | 2/1997 | Pedersen |
| 5,617,058 A | 4/1997 | Adrian et al. |
| 5,631,848 A | 5/1997 | Laczko et al. |
| 5,633,601 A | 5/1997 | Nagaraj |
| 5,636,150 A | 6/1997 | Okamoto |
| 5,636,368 A | 6/1997 | Harrison et al. |
| 5,640,578 A | 6/1997 | Balmer et al. |
| 5,644,519 A | 7/1997 | Yatim |
| 5,644,522 A | 7/1997 | Moyse et al. |
| 5,646,545 A | 7/1997 | Trimberger et al. |
| 5,646,875 A | 7/1997 | Taborn et al. |
| 5,648,732 A | 7/1997 | Duncan |
| 5,652,903 A | 7/1997 | Weng et al. |
| 5,655,069 A | 8/1997 | Ogawara et al. |
| 5,664,192 A | 9/1997 | Lloyd et al. |
| 5,689,195 A | 11/1997 | Cliff et al. |
| 5,696,708 A | 12/1997 | Leung |
| 5,729,495 A | 3/1998 | Madurawe |
| 5,740,404 A | 4/1998 | Baji |
| 5,744,980 A | 4/1998 | McGowan et al. |
| 5,744,991 A | 4/1998 | Jefferson et al. |
| 5,754,459 A | 5/1998 | Telikepalli |
| 5,761,483 A | 6/1998 | Trimberger |
| 5,764,555 A | 6/1998 | McPherson et al. |
| 5,768,613 A | 6/1998 | Asghar |
| 5,771,186 A | 6/1998 | Kodali et al. |
| 5,777,912 A | 7/1998 | Leung et al. |
| 5,784,636 A | 7/1998 | Rupp |
| 5,790,446 A | 8/1998 | Yu et al. |
| 5,794,067 A | 8/1998 | Kadowaki |
| 5,801,546 A | 9/1998 | Pierce et al. |
| 5,805,477 A | 9/1998 | Perner |
| 5,805,913 A | 9/1998 | Guttag et al. |
| 5,808,926 A | 9/1998 | Gorshtein et al. |
| 5,812,479 A | 9/1998 | Cliff et al. |
| 5,812,562 A | 9/1998 | Baeg |
| 5,815,422 A | 9/1998 | Dockser |
| 5,821,776 A | 10/1998 | McGowan |
| 5,825,202 A | 10/1998 | Tavana et al. |
| 5,838,165 A | 11/1998 | Chatter |
| 5,841,684 A | 11/1998 | Dockser |
| 5,847,579 A | 12/1998 | Trimberger |
| 5,847,978 A | 12/1998 | Ogura et al. |
| 5,847,981 A | 12/1998 | Kelley |
| 5,859,878 A | 1/1999 | Phillips et al. |
| 5,869,979 A | 2/1999 | Bocchino |
| 5,872,380 A | 2/1999 | Rostoker et al. |
| 5,874,834 A | 2/1999 | New |
| 5,878,250 A | 3/1999 | LeBlanc |
| 5,880,981 A | 3/1999 | Kojima et al. |
| 5,892,962 A | 4/1999 | Cloutier |
| 5,894,228 A | 4/1999 | Reddy et al. |
| 5,898,602 A | 4/1999 | Rothman et al. |
| 5,931,898 A | 8/1999 | Khoury |
| 5,942,914 A | 8/1999 | Reddy et al. |
| 5,944,774 A | 8/1999 | Dent |
| 5,949,710 A | 9/1999 | Pass et al. |
| 5,951,673 A | 9/1999 | Miyata |
| 5,956,265 A | 9/1999 | Lewis |
| 5,959,871 A | 9/1999 | Pierzchala et al. |
| 5,960,193 A | 9/1999 | Guttag et al. |
| 5,961,635 A | 10/1999 | Guttag et al. |
| 5,963,048 A | 10/1999 | Harrison et al. |
| 5,963,050 A | 10/1999 | Young et al. |
| 5,968,196 A | 10/1999 | Ramamurthy et al. |
| 5,970,254 A | 10/1999 | Cooke et al. |
| 5,978,260 A | 11/1999 | Trimberger et al. |
| 5,982,195 A | 11/1999 | Cliff et al. |
| 5,986,465 A | 11/1999 | Mendel |
| 5,991,788 A | 11/1999 | Mintzer |
| 5,991,898 A | 11/1999 | Rajski et al. |
| 5,995,748 A | 11/1999 | Guttag et al. |
| 5,999,015 A | 12/1999 | Cliff et al. |
| 5,999,990 A | 12/1999 | Sharrit et al. |
| 6,005,806 A | 12/1999 | Madurawe et al. |
| 6,006,321 A | 12/1999 | Abbott |
| 6,009,451 A | 12/1999 | Burns |
| 6,018,755 A | 1/2000 | Gonikberg et al. |
| 6,020,759 A | 2/2000 | Heile |
| 6,021,423 A | 2/2000 | Nag et al. |
| 6,029,187 A | 2/2000 | Verbauwhede |
| 6,031,763 A | 2/2000 | Sansbury |
| 6,041,339 A | 3/2000 | Yu et al. |
| 6,041,340 A | 3/2000 | Mintzer |
| 6,052,327 A | 4/2000 | Reddy et al. |
| 6,052,755 A | 4/2000 | Terrill et al. |
| 6,055,555 A | 4/2000 | Boswell et al. |
| 6,064,614 A | 5/2000 | Khoury |
| 6,065,131 A | 5/2000 | Andrews et al. |
| 6,066,960 A | 5/2000 | Pedersen |
| 6,069,487 A | 5/2000 | Lane et al. |
| 6,072,994 A | 6/2000 | Phillips et al. |
| 6,073,154 A | 6/2000 | Dick |
| 6,075,381 A | 6/2000 | LaBerge |
| 6,084,429 A | 7/2000 | Trimberger |
| 6,085,317 A | 7/2000 | Smith |
| 6,091,261 A | 7/2000 | De Lange |
| 6,091,765 A | 7/2000 | Pietzold, III et al. |
| 6,094,726 A | 7/2000 | Gonion et al. |
| 6,097,988 A | 8/2000 | Tobias |
| 6,098,163 A | 8/2000 | Guttag et al. |
| 6,107,820 A | 8/2000 | Jefferson et al. |
| 6,107,821 A | 8/2000 | Kelem et al. |
| 6,107,824 A | 8/2000 | Reddy et al. |
| 6,130,554 A | 10/2000 | Kolze et al. |

| | | | | | | |
|---|---|---|---|---|---|---|
| 6,140,839 A | 10/2000 | Kaviani et al. | | 6,963,890 B2 | 11/2005 | Dutta et al. |
| 6,144,980 A | 11/2000 | Oberman | | 6,971,083 B1 | 11/2005 | Farrugia et al. |
| 6,154,049 A | 11/2000 | New | | 6,978,287 B1 | 12/2005 | Langhammer |
| 6,157,210 A | 12/2000 | Zaveri et al. | | 6,983,300 B2 | 1/2006 | Ferroussat |
| 6,163,788 A | 12/2000 | Chen et al. | | 7,020,673 B2 | 3/2006 | Ozawa |
| 6,167,415 A | 12/2000 | Fischer et al. | | 7,047,272 B2 | 5/2006 | Giacalone et al. |
| 6,175,849 B1 | 1/2001 | Smith | | 7,062,526 B1 | 6/2006 | Hoyle |
| 6,215,326 B1 | 4/2001 | Jefferson et al. | | 7,093,204 B2 | 8/2006 | Oktem et al. |
| 6,226,735 B1 | 5/2001 | Mirsky | | 7,107,305 B2 | 9/2006 | Deng et al. |
| 6,242,947 B1 | 6/2001 | Trimberger | | 7,113,969 B1 | 9/2006 | Green et al. |
| 6,243,729 B1 | 6/2001 | Staszewski | | 7,181,484 B2 | 2/2007 | Stribaek et al. |
| 6,246,258 B1 | 6/2001 | Lesea | | 7,313,585 B2 | 12/2007 | Winterrowd |
| 6,260,053 B1 * | 7/2001 | Maulik et al. ............. 708/313 | | 7,395,298 B2 | 7/2008 | Debes et al. |
| 6,279,021 B1 | 8/2001 | Takano et al. | | 7,401,109 B2 | 7/2008 | Koc et al. |
| 6,286,024 B1 | 9/2001 | Yano et al. | | 7,409,417 B2 | 8/2008 | Lou |
| 6,314,442 B1 | 11/2001 | Suzuki | | 7,415,542 B2 | 8/2008 | Hennedy et al. |
| 6,314,551 B1 | 11/2001 | Borland | | 7,421,465 B1 | 9/2008 | Rarick et al. |
| 6,321,246 B1 | 11/2001 | Page et al. | | 7,428,565 B2 | 9/2008 | Fujimori |
| 6,323,680 B1 | 11/2001 | Pedersen et al. | | 7,428,566 B2 | 9/2008 | Siu et al. |
| 6,327,605 B2 | 12/2001 | Arakawa et al. | | 7,430,578 B2 | 9/2008 | Debes et al. |
| 6,351,142 B1 | 2/2002 | Abbott | | 7,430,656 B2 | 9/2008 | Sperber et al. |
| 6,353,843 B1 | 3/2002 | Chehrazi et al. | | 7,447,310 B2 | 11/2008 | Koc et al. |
| 6,359,468 B1 | 3/2002 | Park et al. | | 7,472,155 B2 | 12/2008 | Simkins et al. |
| 6,360,240 B1 | 3/2002 | Takano et al. | | 7,508,936 B2 | 3/2009 | Eberle et al. |
| 6,362,650 B1 | 3/2002 | New et al. | | 7,536,430 B2 | 5/2009 | Guevokian et al. |
| 6,366,944 B1 | 4/2002 | Hossain et al. | | 7,567,997 B2 | 7/2009 | Simkins et al. |
| 6,367,003 B1 | 4/2002 | Davis | | 7,590,676 B1 * | 9/2009 | Langhammer ............. 708/319 |
| 6,369,610 B1 | 4/2002 | Cheung et al. | | 7,668,896 B2 | 2/2010 | Lutz et al. |
| 6,377,970 B1 | 4/2002 | Abdallah et al. | | 7,719,446 B2 | 5/2010 | Rosenthal et al. |
| 6,407,576 B1 | 6/2002 | Ngai et al. | | 7,769,797 B2 | 8/2010 | Cho et al. |
| 6,407,694 B1 | 6/2002 | Cox et al. | | 7,930,335 B2 | 4/2011 | Gura |
| 6,427,157 B1 | 7/2002 | Webb | | 7,930,336 B2 | 4/2011 | Langhammer |
| 6,434,587 B1 | 8/2002 | Liao et al. | | 2001/0023425 A1 | 9/2001 | Oberman et al. |
| 6,438,569 B1 | 8/2002 | Abbott | | 2001/0029515 A1 | 10/2001 | Mirsky |
| 6,438,570 B1 | 8/2002 | Miller | | 2001/0037351 A1 | 11/2001 | Hellberg |
| 6,446,107 B1 | 9/2002 | Knowles | | 2001/0037352 A1 | 11/2001 | Hong |
| 6,453,382 B1 | 9/2002 | Heile | | 2002/0002573 A1 | 1/2002 | Landers et al. |
| 6,467,017 B1 | 10/2002 | Ngai et al. | | 2002/0038324 A1 | 3/2002 | Page et al. |
| 6,480,980 B2 | 11/2002 | Koe | | 2002/0049798 A1 | 4/2002 | Wang et al. |
| 6,483,343 B1 | 11/2002 | Faith et al. | | 2002/0078114 A1 | 6/2002 | Wang et al. |
| 6,487,575 B1 | 11/2002 | Oberman | | 2002/0089348 A1 | 7/2002 | Langhammer |
| 6,523,055 B1 | 2/2003 | Yu et al. | | 2002/0116434 A1 | 8/2002 | Nancekievill |
| 6,523,057 B1 | 2/2003 | Savo et al. | | 2003/0088757 A1 | 5/2003 | Lindner et al. |
| 6,531,888 B2 | 3/2003 | Abbott | | 2004/0064770 A1 | 4/2004 | Xin |
| 6,538,470 B1 | 3/2003 | Langhammer et al. | | 2004/0083412 A1 | 4/2004 | Corbin et al. |
| 6,542,000 B1 | 4/2003 | Black et al. | | 2004/0103133 A1 * | 5/2004 | Gurney .................. 708/313 |
| 6,556,044 B2 * | 4/2003 | Langhammer et al. ....... 326/40 | | 2004/0122882 A1 | 6/2004 | Zakharov et al. |
| 6,557,092 B1 | 4/2003 | Callen | | 2004/0148321 A1 | 7/2004 | Guevorkian et al. |
| 6,571,268 B1 | 5/2003 | Giacalone et al. | | 2004/0172439 A1 | 9/2004 | Lin |
| 6,573,749 B2 | 6/2003 | New et al. | | 2004/0178818 A1 | 9/2004 | Crotty et al. |
| 6,574,762 B1 | 6/2003 | Karimi et al. | | 2004/0193981 A1 | 9/2004 | Clark et al. |
| 6,591,283 B1 | 7/2003 | Conway et al. | | 2004/0267857 A1 | 12/2004 | Abel et al. |
| 6,591,357 B2 | 7/2003 | Mirsky | | 2004/0267863 A1 | 12/2004 | Bhushan et al. |
| 6,600,495 B1 | 7/2003 | Boland et al. | | 2005/0038842 A1 | 2/2005 | Stoye |
| 6,600,788 B1 | 7/2003 | Dick et al. | | 2005/0144212 A1 | 6/2005 | Simkins et al. |
| 6,628,140 B2 | 9/2003 | Langhammer et al. | | 2005/0144215 A1 * | 6/2005 | Simkins et al. ............. 708/620 |
| 6,687,722 B1 | 2/2004 | Larsson et al. | | 2005/0144216 A1 | 6/2005 | Simkins et al. |
| 6,692,534 B1 | 2/2004 | Wang et al. | | 2005/0166038 A1 | 7/2005 | Wang et al. |
| 6,700,581 B2 | 3/2004 | Baldwin et al. | | 2005/0187997 A1 | 8/2005 | Zheng et al. |
| 6,725,441 B1 | 4/2004 | Keller et al. | | 2005/0187999 A1 | 8/2005 | Zheng et al. |
| 6,728,901 B1 | 4/2004 | Rajski et al. | | 2005/0262175 A1 | 11/2005 | Iino et al. |
| 6,731,133 B1 | 5/2004 | Feng et al. | | 2006/0020655 A1 | 1/2006 | Lin |
| 6,732,134 B1 | 5/2004 | Rosenberg et al. | | 2007/0083585 A1 | 4/2007 | St. Denis et al. |
| 6,744,278 B1 | 6/2004 | Liu et al. | | 2007/0185951 A1 | 8/2007 | Lee et al. |
| 6,745,254 B2 | 6/2004 | Boggs et al. | | 2007/0185952 A1 | 8/2007 | Langhammer et al. |
| 6,763,367 B2 | 7/2004 | Kwon et al. | | 2007/0241773 A1 | 10/2007 | Hutchings et al. |
| 6,771,094 B1 | 8/2004 | Langhammer et al. | | 2008/0133627 A1 | 6/2008 | Langhammer et al. |
| 6,774,669 B1 | 8/2004 | Liu et al. | | 2008/0183783 A1 | 7/2008 | Tubbs |
| 6,781,408 B1 | 8/2004 | Langhammer | | 2009/0172052 A1 | 7/2009 | DeLaquil et al. |
| 6,781,410 B2 | 8/2004 | Pani et al. | | 2009/0187615 A1 | 7/2009 | Abe et al. |
| 6,788,104 B2 | 9/2004 | Singh et al. | | 2009/0300088 A1 | 12/2009 | Michaels et al. |
| 6,801,924 B1 | 10/2004 | Green et al. | | 2010/0098189 A1 | 4/2010 | Oketani |
| 6,806,733 B1 | 10/2004 | Pan et al. | | | | |
| 6,836,839 B2 | 12/2004 | Master et al. | | FOREIGN PATENT DOCUMENTS | | |
| 6,874,079 B2 | 3/2005 | Hogenauer | | EP | 0 380 456 | 8/1990 |
| 6,889,238 B2 | 5/2005 | Johnson | | EP | 0 411 491 | 2/1991 |
| 6,904,471 B2 | 6/2005 | Boggs et al. | | EP | 0 461 798 | 12/1991 |
| 6,917,955 B1 | 7/2005 | Botchev | | EP | 0 498 066 | 8/1992 |
| 6,924,663 B2 | 8/2005 | Masui et al. | | EP | 0 555 092 | 8/1993 |

| | | |
|---|---|---|
| EP | 0 606 653 | 7/1994 |
| EP | 0 657 803 | 6/1995 |
| EP | 0 660 227 | 6/1995 |
| EP | 0 668 659 | 8/1995 |
| EP | 0 721 159 | 7/1996 |
| EP | 0 905 906 | 3/1999 |
| EP | 0 909 028 | 4/1999 |
| EP | 0 927 393 | 7/1999 |
| EP | 0 992 885 | 4/2000 |
| EP | 1 031 934 | 8/2000 |
| EP | 1 049 025 | 11/2000 |
| EP | 1 058 185 | 12/2000 |
| EP | 1 220 108 | 7/2002 |
| GB | 2 283 602 | 5/1995 |
| GB | 2 286 737 | 8/1995 |
| GB | 2 318 198 | 4/1998 |
| JP | 61-237133 | 10/1986 |
| JP | 63-216131 | 8/1988 |
| JP | 4-332036 | 11/1992 |
| JP | 5-134851 | 6/1993 |
| JP | 06-187129 | 7/1994 |
| JP | 7-135447 | 5/1995 |
| JP | 11-296345 | 10/1999 |
| JP | 2000-259394 | 9/2000 |
| JP | 2002-108606 | 4/2002 |
| JP | 2002-251281 | 9/2002 |
| WO | WO95-27243 | 10/1995 |
| WO | WO96-28774 | 9/1996 |
| WO | WO97-08606 | 3/1997 |
| WO | WO98-12629 | 3/1998 |
| WO | WO98-32071 | 7/1998 |
| WO | WO98-38741 | 9/1998 |
| WO | WO99-22292 | 5/1999 |
| WO | WO99-31574 | 6/1999 |
| WO | WO99-56394 | 11/1999 |
| WO | WO00-51239 | 8/2000 |
| WO | WO00-52824 | 9/2000 |
| WO | WO01-13562 | 2/2001 |
| WO | WO 2005/066832 | 7/2005 |
| WO | WO2005-101190 | 10/2005 |

OTHER PUBLICATIONS

Altera Corporation, "DSP Blocks in Stratix II and Stratix II GX Devices," *Stratix II Device Handbook*, vol. 2, Chapter 6, v4.0 (Oct. 2005).
Amos, D., "PLD architectures match DSP algorithms," *Electronic Product Design*, vol. 17, No. 7, Jul. 1996, pp. 30, 32.
Analog Devices, Inc., The Applications Engineering Staff of Analog Devices, DSP Division, *Digital Signal Processing Applications Using the ADSP-2100 Family* (edited by Amy Mar), 1990, pp. 141-192).
Andrejas, J., et al., "Reusable DSP functions in FPGAs," *Field-Programmable Logic and Applications. Roadmap to Reconfigurable Computing. 10th International Conference, FPL 2000. Proceedings (Lecture Notes in Computer Science* vol. 1896) Aug. 27-30, 2000, pp. 456-461.
Aoki, T., "Signed-weight arithmetic and its application to a field-programmable digital filter architecture," *IEICE Transactions on Electronics*, 1999, vol. E82C, No. 9, Sep. 1999, pp. 1687-1698.
Ashour, M.A., et al., "An FPGA implementation guide for some different types of serial-parallel multiplier-structures," *Microelectronics Journal*, vol. 31, No. 3, 2000, pp. 161-168.
Berg. B.L., et al."Designing Power and Area Efficient Multistage FIR Decimators with Economical Low Order Filters," *ChipCenter Technical Note*, Dec. 2001.
Bursky, D., "Programmable Logic Challenges Traditional ASIC SoC Designs", *Electronic Design*, Apr. 15, 2002.
Chhabra, A. et al., Texas Instruments Inc., "A Block Floating Point Implementation on the TMS320C54x DSP", Application Report SPRA610, Dec. 1999, pp. 1-10.
Colet, p., "When DSPs and FPGAs meet: Optimizing image processing architectures," *Advanced Imaging*, vol. 12, No. 9, Sep. 1997, pp. 14, 16, 18.
Crookes, D., et al., "Design and implementation of a high level programming environment for FPGA-based image processing," *IEE Proceedings-Vision, Image and Signal Processing*, vol. 147, No. 4, Aug. 2000, pp. 377-384.
Debowski, L., et al., "A new flexible architecture of digital control systems based on DSP and complex CPLD technology for power conversion applications," *PCIM 2000: Europe Official Proceedings of the Thirty-Seventh International Intelligent Motion Conference*, Jun. 6-8, 2000, pp. 281-286.
Dick, C., et al., "Configurable logic for digital communications: some signal processing perspectives," *IEEE Communications Magazine*, vol. 37, No. 8, Aug. 1999, pp. 107-111.
Do, T.-T., et al., "A flexible implementation of high-performance FIR filters on Xilinx FPGAs," *Field-Programmable Logic and Applications: From FPGAs to Computing Paradigm. 8th International Workshop, FPL '98. Proceedings*, Hartenstein, R.W., et al., eds., Aug. 31-Sep. 3, 1998, pp. 441-445.
Gaffer, A.A., et al., "Floating-Point Bitwidth Analysis via Automatic Differentiation," *IEEE Conference on Field Programmable Technology*, Hong Kong, Dec. 2002.
Guccione, S.A.,"Run-time Reconfiguration at Xilinx," *Parallel and distributed processing: 15 IPDPS 2000 workshops*, Rolim, J., ed., May 1-5, 2000, p. 873.
Hauck, S., "The Future of Reconfigurable Systems," *Keynote Address, 5th Canadian Conference on Field Programmable Devices*, Jun. 1998, http:—.www.ee.washington.edu-people-faculty-hauck-publications-ReconfigFuture.PDF.
Heysters, P.M., et al., "Mapping of DSP algorithms on field programmable function arrays," *Field-Programmable Logic and Applications. Roadmap to Reconfigurable Computing. 10th International Conference, FPL 2000. Proceedings (Lecture Notes in Computer Science* vol. 1896) Aug. 27-30, 2000, pp. 400-411.
Huang, J., et al., "Simulated Performance of 1000BASE-T Receiver with Different Analog Front End Designs," *Proceedings of the 35th Asilomar.Conference on Signals, Systems, and Computers*, Nov. 4-7, 2001.
Lattice Semiconductor Corp, *ORCA® FPGA Express™ Interface Manual:.ispLEVER® Version 3.0*, 2002.
Lucent Technologies, Microelectronics Group,"Implementing and Optimizing Multipliers in ORCA™ FPGAs,", Application Note. AP97-008FGPA, Feb. 1997.
"Implementing Multipliers in FLEX 10K EABs", *Altera*, Mar. 1996.
"Implementing Logic with the Embedded Array in FLEX 10K Devices", *Altera*, May 2001, ver. 2.1.
Jinghua Li, "Design a pocket multi-bit multiplier in FPGA" *1996 2nd International Conference on ASIC Proceedings (IEEE Cat. No. 96TH8140)* Oct. 21-24, 1996, pp. 275-279.
Jones, G., "Field-programmable digital signal conditioning," *Electronic Product Design*, vol. 21, No. 6, Jun. 2000, pp. C36-C38.
Kiefer, R., et al., "Performance comparison of software-FPGA hardware partitions for a DSP application," *14th Australian Microelectronics Conference Microelectronics: Technology Today for the Future. MICRO '97 Proceedings*, Sep. 28-Oct. 1, 1997, pp. 88-93.
Kramberger, I., "DSP acceleration using a reconfigurable FPGA," *ISIE '99. Proceedings of the IEEE International Symposium on Industrial Electronics (Cat. No. 99TH8465)*, vol. 3, Jul. 12-16, 1999, pp. 1522-1525.
Langhammer, M., "How to implement DSP in programmable logic," *Elettronica Oggi*, No. 266, Dec. 1998, pp. 113-115.
Langhammer, M., "Implementing a DSP in Programmable Logic " *Online EE Times*, May 1998, http:--www.eetimes.com-editorial-1998-coverstory9805.html.
Lazaravich, B.V., "Function block oriented field programmable logic arrays," *Motorola, Inc. Technical Developments*, vol. 18, Mar. 1993, pp. 10-11.
Lund, D., et al., "A new development system for reconfigurable digital signal processing," *First International Conference on 3G Mobile Communication Technologies (Conf. Publ. No. 471)*, Mar. 27-29, 2000, pp. 306-310.
Miller, N. L., et al., "Reconfigurable integrated circuit for high performance computer arithmetic," *Proceedings of the 1998 IEE Colloquium on Evolvable Hardware Systems (Digest)*, No. 233, 1998, pp. 2-1-2-4.
Mintzer, L., "Xilinx FPGA as an FFT processor," *Electronic Engineering*, vol. 69, No. 845, May 1997, pp. 81, 82, 84.

Faura et al., "A Novel Mixed Signal Programmable Device With On-Chip Microprocessor," Custom Integrated Circuits Conference, 1997. Proceedings of the IEEE 1997 Santa Clara, CA, USA, May 15, 997, pp. 103-106.

Nozal, L., et al., "A new vision system: programmable logic devices and digital signal processor architecture (PLD+DSP)," *Proceedings IECON '91. 1991 International Conference on Industrial Electronics, Control and Instrumentation (Cat. No. 91CH2976-9)* vol. 3, Oct. 28-Nov. 1, 1991, pp. 2014-2018.

Papenfuss, J.R, et al., "Implementation of a real-time, frequency selective, RF channel simulator using a hybrid DSP-FPGA architecture," *RAWCON 2000: 2000 IEEE Radio and Wireless Conference (Cat. No. 00EX404)*, Sep. 10-13, 2000, pp. 135-138.

Parhami, B., "Configurable arithmetic arrays with data-driven control," *34th Asilomar Conference on Signals, Systems and Computers*, vol. 1, 2000, pp. 89-93.

"The QuickDSP Design Guide", Quicklogic, Aug. 2001, revision B.

"QuickDSP™ Family Data Sheet", *Quicklogic*, Aug. 7, 2001, revision B.

Rangasayee, K., "Complex PLDs let you produce efficient arithmetic designs," *EDN (European Edition)*, vol. 41,No. 13, Jun. 20, 1996, pp. 109, 110, 112, 114, 116.

Rosado, A., et al., "A high-speed multiplier coprocessor unit based on FPGA," *Journal of Electrical Engineering*, vol. 48, No. 11-12, 1997, pp. 298-302.

Santillan-Q., G.F., et al., "Real-time integer convolution implemented using systolic arrays and a digit-serial architecture in complex programmable logic devices," *Proceedings of the Third International Workshop on Design of Mixed-Mode Integrated Circuits and Applications (Cat. No. 99EX303)*, Jul. 26-28,1999, pp. 147-150.

Texas Instruments Inc., "TMS320C54x DSP Reference Set, vol. 1: CPU and Peripherals", Literature No. SPRU131F, Apr. 1999, pp. 2-1 through 2-16 and 4-1 through 4-29.

Tisserand, A., et al., "An on-line arithmetic based FPGA for low power custom computing," *Field Programmable Logic and Applications, 9th International Workshop, FPL '99, Proceedings (Lecture Notes in Computer Science* vol. 1673), Lysaght, P., et al., eds., Aug. 30-Sep. 1, 1999, pp. 264-273.

Tralka, C., "Symbiosis of DSP and PLD," *Elektronik*, vol. 49, No. 14 , Jul. 11, 2000, pp. 84-96.

Underwood, K. "FPGAs vs. CPUs: Trends in Peak Floating-Point Performance," *Proceedings of the 2004 ACM-SIGDA 12th International Symposium on Field Programmable Gate Arrays*, pp. 171-180, Feb. 22-24, 2004.

Valls, J., et al., "A Study About FPGA-Based Digital Filters," *Signal Processing Systems, 1998*, SIPS 98, 1998 IEEE Workshop, Oct. 10, 1998, pp. 192-201.

"Virtex-II 1.5V Field-Programmable Gate Arrays", *Xilinx*, Jan. 25, 2001, module 2 of 4.

"Virtex-II 1.5V Field-Programmable Gate Arrays", *Xilinx*, Apr. 2, 2001, module 1 of 4.

"Virtex-II 1.5V Field-Programmable Gate Arrays", *Xilinx*, Apr. 2, 2001, module 2 of 4.

Walters, A.L., "A Scaleable FIR Filter Implementation Using 32-bit Floating-Point Complex Arithmetic on ,a FPGA Based Custom Computing Platform," Allison L. Walters, Thesis Submitted to the Faculty of Virginia Polytechnic Institute and State University, Jan. 30, 1998.

Weisstein, E.W., "Karatsuba Multiplication," *MathWorld—A Wolfram Web Resource* (Dec. 9, 2007), accessed Dec. 11, 2007 at http:—mathworld.wolfram.com-KaratsubaMultiplication.html.

Wenzel, L., "Field programmable gate arrays (FPGAs) to replace digital signal processor integrated circuits," *Elektronik* , vol. 49, No. 5, Mar. 7, 2000, pp. 78-86.

"Xilinx Unveils New FPGA Architecture to Enable High-Performance, 10 Million System Gate Designs", *Xilinx*, Jun. 22, 2000.

"Xilinx Announces DSP Algorithms, Tools and Features for Virtex-II Architecture", *Xilinx*, Nov. 21, 2000.

Xilinx Inc., "Virtex-II 1.5V Field-Programmable Gate Arrays", Advance Product Specification, DS031-2 (v1.9), Nov. 29, 2001, Module 2 of 4, pp. 1-39.

Xilinx Inc., "Using Embedded Multipliers", Virtex-II Platform FPGA Handbook, UG002 (v1.3), Dec. 3, 2001, pp. 251-257.

Xilinx, Inc., "A 1D Systolic FIR," copyright 1994-2002, downloaded from http:--www.iro.umontreal.ca-~aboulham-F6221-Xilinx%20A%201D%20systolic%20FIR.htm.

Xilinx, Inc., "The Future of FPGA's," White Paper, available Nov. 14, 2005 for download from http:--www.xilinx.com-prs_rls,5yrwhite.htm.

Xilinx Inc., " XtremeDSP Design Considerations User Guide," v 1.2, Feb. 4, 2005.

Altera Corporation, "Stratix II Device Handbook, Chapter 6—DSP Blocks in Stratix II Devices," v1.1, Jul. 2004.

Xilinx Inc., "Complex Multiplier v2.0", DS291 Product Specification/Datasheet, Nov. 2004.

Haynes, S.D., et al., "Configurable multiplier blocks for embedding in FPGAs," *Electronics Letters*, vol. 34, No. 7, pp. 638-639 (Apr. 2, 1998).

Altera Corporation, "FIR Compiler: MegaCore® Function User Guide," version 3.3.0, rev. 1, pp. 3 11 through 3 15 (Oct. 2005).

Nakasato, N., et al., "Acceleration of Hydrosynamical Simulations using a FPGA board", *The Institute of Electronics Information and Communication Technical Report CPSY2005-47*, vol. 105, No. 515, Jan. 17, 2006.

Osana, Y., et al., "Hardware-resource Utilization Analysis on an FPGA-Based Biochemical Simulator ReSCiP", *The Instititue of Electronics Information and Communication Technical Report CPSY2005-63*, vol. 105, No. 516, Jan. 18, 2006.

Govindu, G. et al., "A Library of Parameterizable Floating-Point Cores for FPGAs and Their Application to Scientific Computing," *Proc Int'l Conf. Eng. Reconfigurable Systems and Algorithms (ERSA '05)*, Jun. 2005.

Govindu, G. et al., "Analysis of High-performance Floating-point Arithmetic on FPGAs," *Proceedings of the 18th International Parallel and Distributed Processing Symposium (PDPS'04)*, pp. 149-156, Apr. 2004.

Kim, Y., et al., "Fast GPU Implementation for the Solution of Tridiagonal Matrix Systems," *Journal of Korean Institute of Information Scientists and Engineers*, vol. 32, No. 12, pp. 692-704, Dec. 2005.

Vladimirova, T. et al., "Floating-Point Mathematical Co-Processor for a Single-Chip On-Board Computer," *MAPLD'03 Conference*, D5, Sep. 2003.

Altera Corporation, "Advanced Synthesis Cookbook: A Design Guide for Stratix II, Stratix III and Stratix IV Devices," Document Version 3.0, 112 pgs., May 2008.

deDinechin, F. et al., "Large multipliers with less DSP blocks," retrieved from http://hal-ens-lyon.archives-ouvertes.fr/ensl-00356421/en/, 9 pgs., 2009.

Martinson, L. et al., "Digital Matched Filtering with Pipelined Floating Point Fast Fourier Transforms (FFT's)," *IEEE Transactions on Acoustics, Speech, and Signal Processing* vol. ASSP-23, No. 2, pp. 222-234, Apr. 1975.

Wajih, E.-H.Y. et al., "Efficient Hardware Architecture of Recursive Karatsuba-Ofman Multiplier," $3^{rd}$ *International Conference on Design and Technology of Integrated Systems in Nanoscale Era*, 6 pgs., Mar. 2008.

Zhou, G. et al., "Efficient and High-Throughput Implementations of AES-GCM on FPGAs," *International Conference on Field-Programmable Technology*, 8 pgs., Dec. 2007.

Farooqui, A., et al., "General Data-Path Organization of a MAC unit for VLSI Implementation of DSP Processors," ISCAS '98, Part 2, May 31, 1998-Jun. 3, 1998, pp. 260-263.

\* cited by examiner

METHOD FOR CONFIGURING A FINITE IMPULSE RESPONSE FILTER IN A PROGRAMMABLE LOGIC DEVICE

BACKGROUND OF THE INVENTION

This invention relates to a method for configuring a finite impulse response filter in a programmable logic device, and more particularly to efficiently configuring a finite impulse response filter of arbitrary size.

Programmable logic devices are well known. Early programmable logic devices were one-time configurable. For example, configuration may have been achieved by "blowing"—i.e., opening—fusible links. Alternatively, the configuration may have been stored in a programmable read-only memory. Those devices generally provided the user with the ability to configure the devices for "sum-of-products" (or "P-TERM") logic operations. Later, such programmable logic devices incorporating erasable programmable read-only memory (EPROM) for configuration became available, allowing the devices to be reconfigured.

Still later, programmable logic devices incorporating static random access memory (SRAM) elements for configuration became available. These devices, which also can be reconfigured, store their configuration in a nonvolatile memory such as an EPROM, from which the configuration is loaded into the SRAM elements when the device is powered up. These devices generally provide the user with the ability to configure the devices for look-up-table-type logic operations.

As programmable logic devices have become larger, it has become more common to add specialized blocks to perform particular functions that have become more common in programmable logic devices. For example, at some point, such devices began to be provided with embedded blocks of random access memory that could be configured by the user to act as random access memory, read-only memory, or logic (such as P-TERM logic); such embedded blocks might even be provided in different sizes on the same device. Other types of memory, such as read-only memory (ROM) or shift registers, also have been provided. More recently, multiplier circuits have been provided on programmable logic devices. Whereas in prior programmable logic devices space was not available for dedicated multipliers, current larger devices can accommodate multipliers. This spares users from having to create multipliers by configuring the available logic. Moreover, as described in commonly-assigned U.S. Pat. No. 6,538,470, which is hereby incorporated by reference in its entirety, specialized multiplier blocks may be provided including multipliers and other arithmetic circuits such as adders and/or subtracters and/or accumulators. Such blocks are sometimes referred to as "multiplier-accumulator blocks" or "MAC blocks." Such blocks, for example, may be useful in digital signal processing, such as is performed in audio applications, and therefore such specialized multiplier blocks also are sometimes referred to as "DSP blocks."

Such specialized multiplier blocks typically are capable of operations up to a certain size. For example, a specialized multiplier block may be provided that can perform a single 36-bit-by-36-bit multiplication operation, or up to four individual 18-bit-by-18-bit multiplication operations which can be combined by the aforementioned adders.

One use for such a specialized multiplier block may be as a finite impulse response (FIR) filter, or portion of a FIR filter. In a FIR filter, which is commonly used for DSP operations, samples of a signal to be processes are multiplied by a fixed set of coefficients and those products are added together. A FIR filter may be characterized by its number of taps, which corresponds to the number of multipliers and also to the number of coefficients.

A specialized multiplier block of the type described above necessarily has a finite number of multipliers. While such a block is particularly well-adapted to be configured as a FIR filter, if the number of multipliers required (i.e., the number of taps) exceeds the number of multipliers in the block, then more than one block must be used to create the required filter. For example, specialized multiplier blocks in the STRATIX® family of PLDs available from Altera Corporation, of San Jose, Calif., specialized multiplier blocks typically have four multipliers. On the other hand, in many DSP applications, FIR filters with over 200 taps are not unheard of. Thus, implementation of a FIR filter is frequently spread over a large number of specialized multiplier blocks, giving rise to routing and speed issues.

It would be desirable to be able to configure a FIR filter in a programmable logic device as efficiently as possible for a given number of filter taps.

SUMMARY OF THE INVENTION

The present invention achieves greater efficiency in the configuration of specialized functional blocks of the type described above as FIR filters, by providing a configuration method that combines aspects of different forms of FIR filters in a way that is more efficient.

FIR filters can be arranged in any of several forms. Among those forms are the Direct Form (including Direct Form I and Direct Form II) and the Transpose Form. In the Direct Form, a set of coefficients is input to the multipliers, and the entire chain of samples is shifted to each multiplier. On each clock cycle, all of the products are different, and are summed to provide the output for that clock cycle. Although Direct Form FIR filters map easily onto specialized functional blocks of the type described above—indeed, a 4-tap Direct Form FIR filter can be implemented entirely in one such block in the aforementioned STRATIX® family of devices—larger filters may require a long input sample chain and a large adder tree that is difficult to route and limits the maximum clock speed attainable.

In a Transpose Form FIR filter, the coefficients are input as above. On each clock cycle, the same sample is input to all multipliers. The result of each multiplication is stored in a one-cycle delay and added on the next cycle to the result of the adjacent multiplication. The output for each cycle is the sum at the end of the chain. A Transpose Form FIR filter therefore requires no sample chain and no adder tree. However, the required adders become progressively wider down the chain (because the sum becomes wider as more stages are added in), with the result that a large number of adders have large widths, which limits the maximum clock speed attainable. In addition, because each stage requires one multiplier and one adder (to add each product to the delayed sum of the upstream stages), Transpose Form FIR filters do not map well onto specialized functional blocks of the type described above, which generally have fewer adders than multipliers.

In accordance with the invention, specialized functional blocks in PLDs are configured as a hybrid form of FIR filter, including characteristics of both Direct Form and Transpose Form FIR filters, but providing mathematically identical results and having fewer disadvantages than either form when mapped onto specialized functional blocks. The invention provides a hybrid FIR filter including a first number of Transpose Form FIR filter stages, where each stage is a Direct Form FIR filter.

A method is provided according to the invention for programmably configuring a programmable logic device as a hybrid FIR filter, where the programmable logic device is of a type having a plurality of specialized processing blocks each of which includes a plurality of multipliers and circuitry for adding outputs of the multipliers. The method includes programmably configuring each of a first number of the specialized processing blocks as a respective Direct Form FIR filter. An adder chain is programmably configured to add outputs of the Direct Form FIR filters. The adder chain includes a respective delay between each of the Direct Form FIR filters. As a result, the programmable logic device is configured as a Transpose Form FIR filter having a number of stages equal to said first number, with each stage being one of the Direct Form FIR filters.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

As described above, FIR filters are common structures used in many DSP applications. Mathematically, a FIR filter may be described as:

$$Yk = \sum_{i=0}^{Taps-1} Ci \cdot Sk - i$$

where $Y_k$ is the kth output term, $c_i$ is the ith coefficient, $s_{k-i}$ is the (k−i)th sample, and Taps is the number of taps in the filter.

Figure 1:
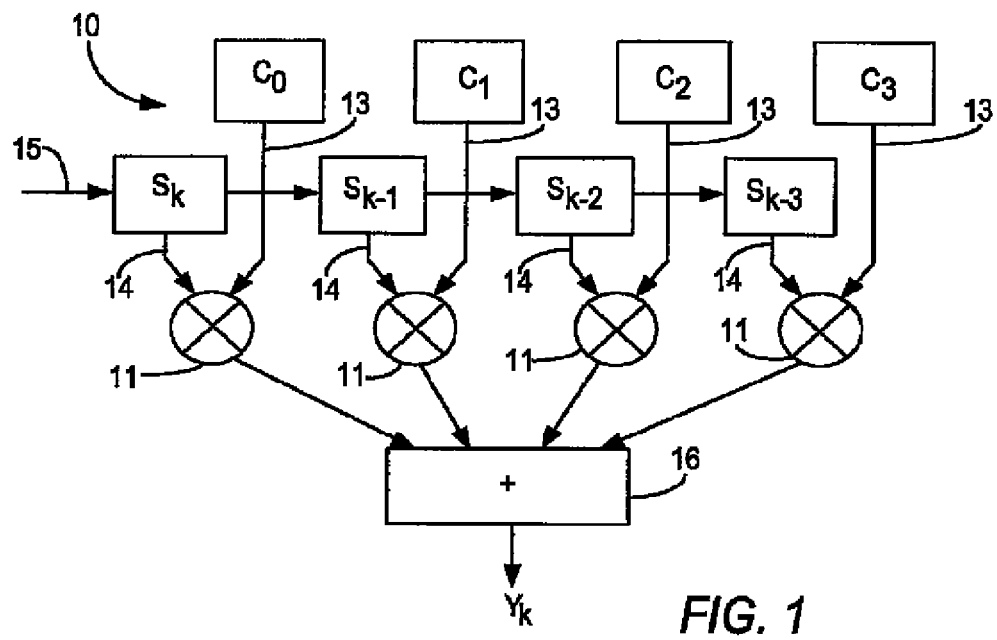
FIG. 1 is a schematic representation of a 4-tap Direct Form FIR filter.

The structure of a 4-tap Direct Form II FIR filter 10 is shown in FIG. 1, and includes four multipliers 11. The multiplier outputs are added by adder tree 12, shown schematically in collapsed form, to provide term $Y_k$. Each multiplier 11 has a coefficient input 13 for one of the four coefficients $c_0$-$c_3$. In some applications, the coefficients are held constant, while in others, such as adaptive filters, decimation filters, interpolation filters, etc., they may change. Each multiplier 11 also has a sample input 14, and the samples $s_k$ are clocked in via sample chain 15. The kth term $Y_k$ is provided when coefficient $c_0$ is being multiplied by the kth sample $s_k$ and the other coefficients $c_1$-$c_3$ are being multiplied by the (k−1)th through (k−3)th samples, added by adder 16 as shown. Thus, as each new sample is clocked in, the previous samples are reused, so that they are used a total number of times equal to the number of taps as follows:

$$y_0 = c_0 s_0 + c_1 s_{-1} + c_2 s_{-2} + c_3 s_{-3}$$

$$y_1 = c_0 s_1 + c_1 s_0 + c_2 s_{-1} + c_3 s_{-2}$$

$$y_2 = c_0 s_2 + c_1 s_1 + c_2 s_{-0} + c_3 s_{-1}$$

$$y_3 = c_0 s_3 + c_1 s_2 + c_2 s_1 + c_3 s_0$$

$$y_4 = c_0 s_4 + c_1 s_3 + c_2 s_2 + c_3 s_1$$

As explained above, if the number of taps is large, the number of multipliers needed is large, as is the size of the required adder tree, and moreover the sample rate dictates the number of multiplications that must be performed during each clock cycle. For more than four taps, sample chain 15 would extend to the right, to the next group of multipliers. The number of taps that may be required in any application is arbitrary. Therefore, in a PLD implementation, where the number of multipliers and associated adders grouped in a single block is necessarily finite, a large number of taps translates into a large number of blocks, leading to a large routing problem as well as the implementation of a large adder tree, with all of the consequent effects on latency and attainable clock speeds. At the same time, however, the structure of the specialized functional blocks described above is well-suited to the Direct Form II FIR filter.

Figure 2:
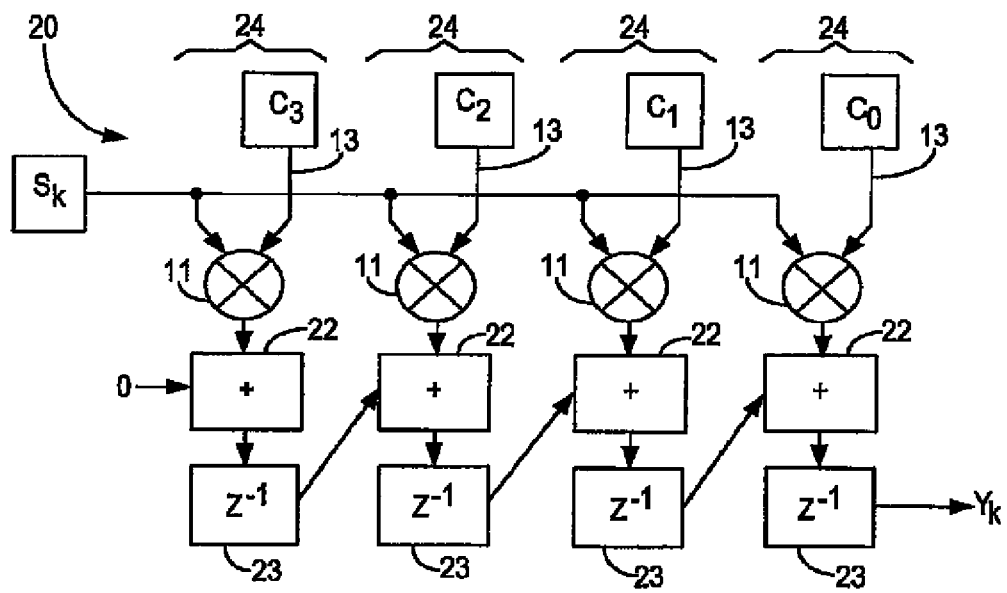
FIG. 2 is a schematic representation of a 4-tap Transpose Form FIR filter.
Figure 3:
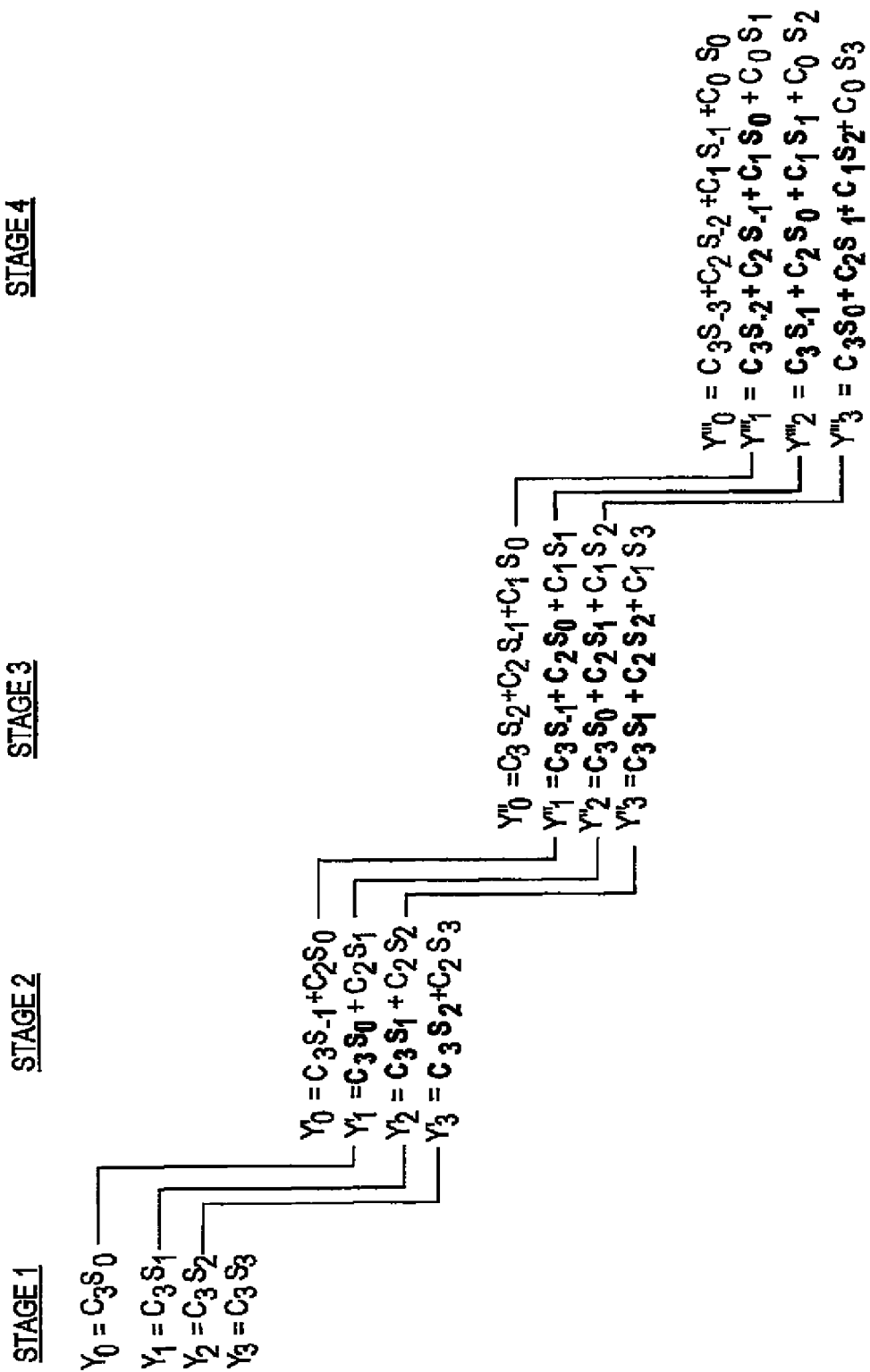
FIG. 3 is a representation of the chaining of results between stages of a Transpose Form FIR filter.

FIG. 2 shows the structure of a 4-tap Transpose Form FIR filter 20, which again includes four multipliers 11. Once again, each multiplier 11 has a coefficient input 13, and the four coefficients $c_0$-$c_3$ are held constant. However, instead of clocking in the samples $s_k$ via a sample chain as in FIG. 1, in Transpose FIR filter 20, the kth sample is input to each multiplier 11 substantially simultaneously. In other words, all multipliers 11 receive the same sample input, with the output of each multiplier added by respective adder 22 to the delayed output of the previous adder 22, as delayed by one of one-clock-cycle delay elements 23. Each combination of a multiplier 11, adder 22 and delay element 23 may be referred to as a "stage" 24 of filter 20. In the first stage, the second input to adder 22 may be zero, as shown. The kth term $Y_k$ is provided from the stage 24 whose coefficient is $c_0$. Thus, only one sample is required at any one time, but the results for each sample are stored in delays 23 and added into the next stage, as shown in FIG. 3.

The Transpose Form FIR filter has the advantage, as compared to the Direct Form, that neither a sample chain nor a large adder tree is required. However, the average adder width is greater than in the Direct Form. Indeed, in some embodiments, as many as half of all adders used to implement the filter are of the maximum width. Large adder widths have a detrimental effect on the maximum attainable clock speed. In addition, as compared to the Direct Form FIR filter, a Transpose Form FIR filter is not as easily implemented in the specialized functional block described above.

Figure 4:
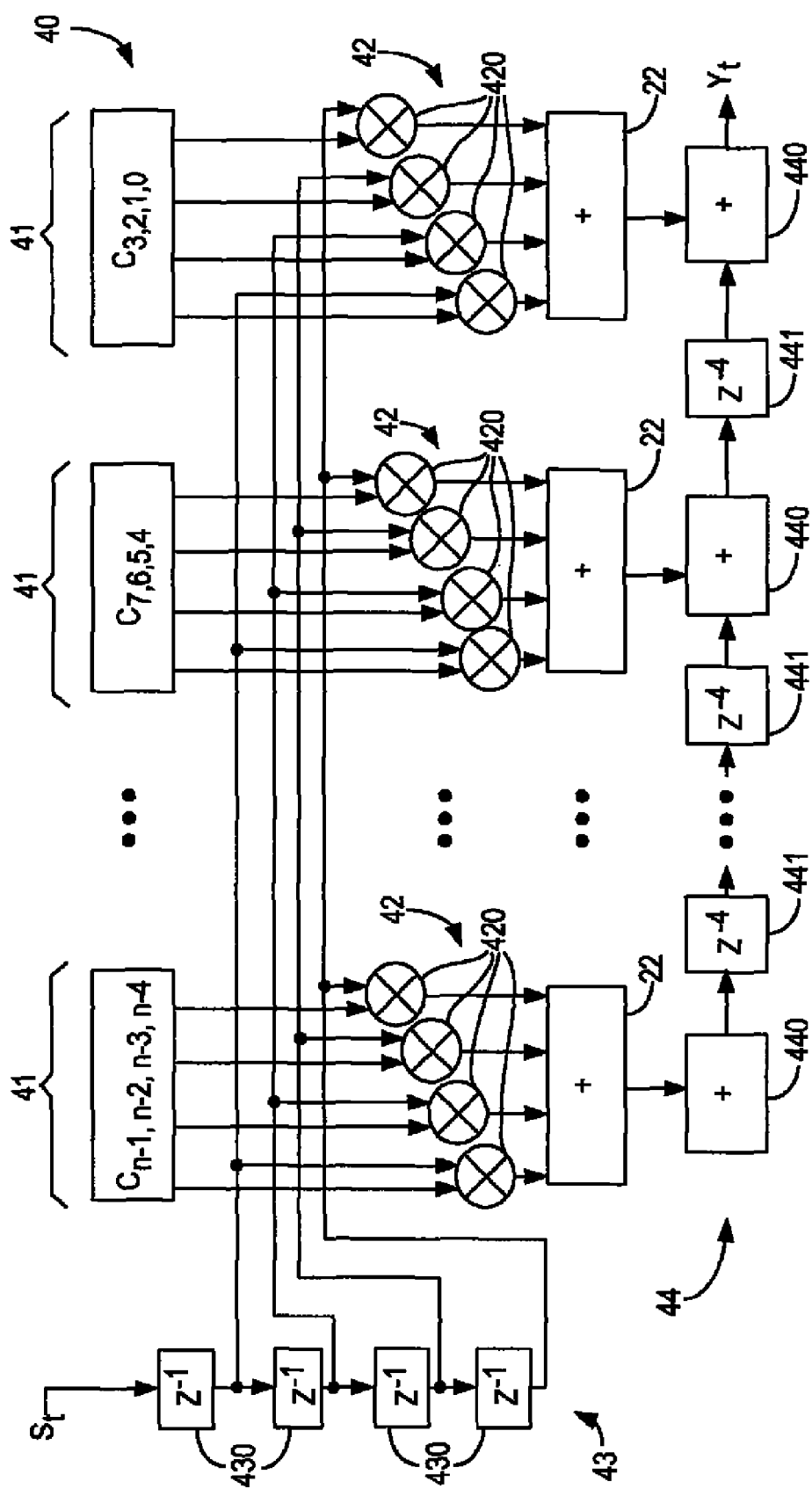
FIG. 4 is a schematic representation of a multitap hybrid form FIR filter in accordance with the present invention, incorporating stages each of which is a 4-tap Direct Form FIR filter.

The present invention combines the advantages of the Direct Form and Transpose Form FIR filters. In accordance with the invention, one embodiment of which is shown in FIG. 4, a FIR filter 40 of the Transpose Form type has as each of its stages 41 a FIR filter unit 42 of the Direct Form type. In this embodiment 40, FIR filter unit 42 includes four multipliers 420. The specialized multiplier blocks described above, having four multipliers, are particularly well-suited to implementing this embodiment 40.

Instead of inputting one sample $s_k$ at a time to all stages, four samples $s_t$ are input at any one time. The most recent sample $s_t$ is input substantially simultaneously to the leftmost (as depicted in FIG. 4) multiplier 420 in each of units 42 while each of three less recent samples $s_t$ is input substantially simultaneously to a respectively further rightward (as depicted in FIG. 4) one of the multipliers 420. A chain 43 of registers or delays 430 of one clock period each is required to maintain the four samples $s_t$.

The number—in this embodiment, four—of delays 430 in chain 43 may be referred to as the depth, $n_d$, of the hybrid Transpose/Direct Form FIR filter 40. A cascade adder chain 44 is used to add the results of the stages 41. Unlike Transpose Form FIR filter 20 in which the output of each stage is stored in a one-clock-cycle delay 23, because it takes four clock periods to clock all samples into sample chain 43, each delay 441 between adders 440 of adder chain 44 is four clock periods long. The number of stages 41 of hybrid filter 40 may be referred to as the width, $n_t$, of filter 40. The product $n_t \times n_d$ is equal to the number of taps of filter 40.

Similarly to the case of Transpose Form FIR filter 20, in which only one sample is required at any one time, but the results for each sample are stored in delays 23 and added into the next stage, as shown in FIG. 3, in hybrid Transpose/Direct Form FIR filter 40, only four samples are required at any one time, but the results for each group of four samples are stored in delays 441 and added into the next stage.

Figure 5:
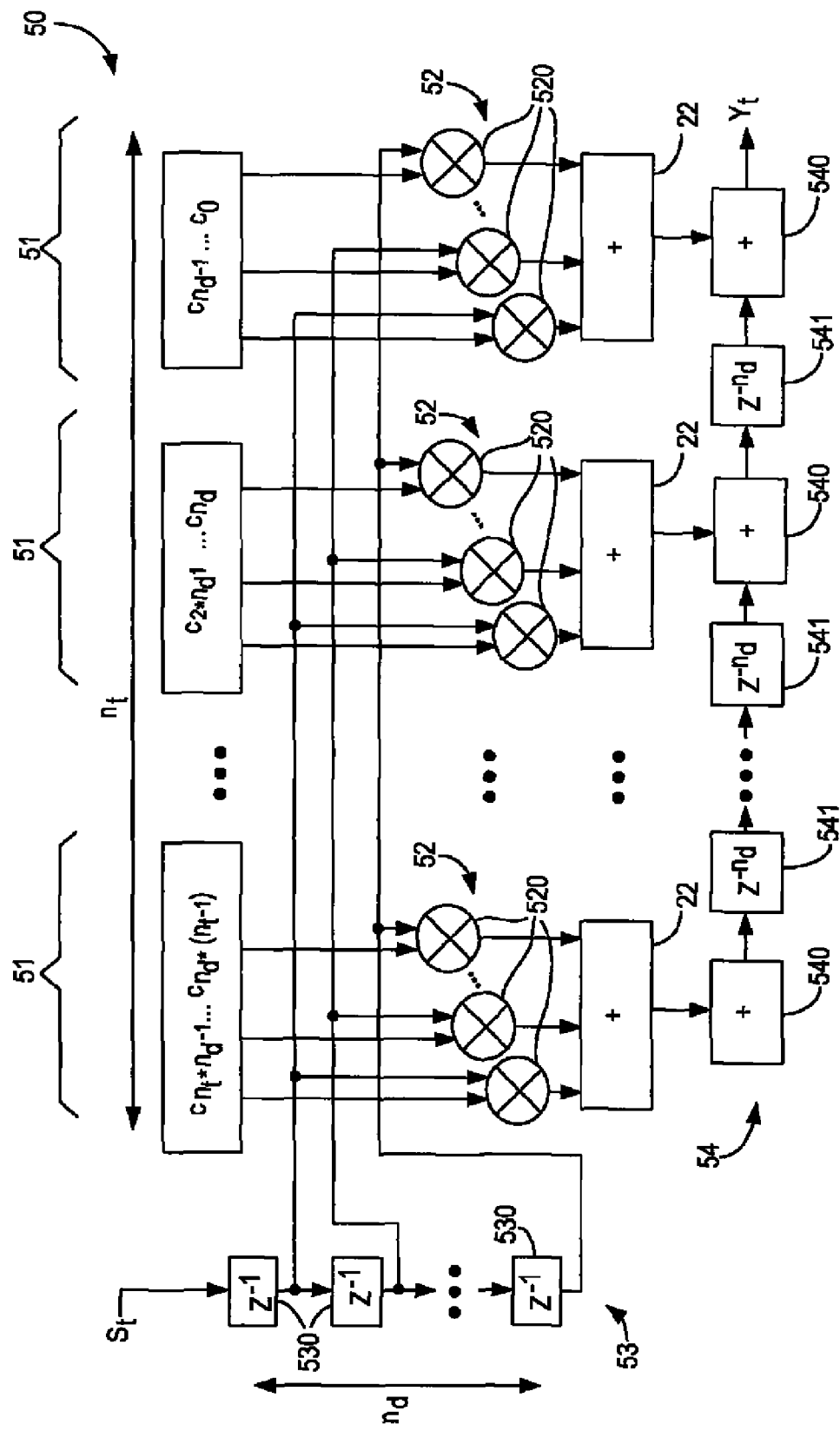
FIG. 5 is a schematic representation of a multitap hybrid form FIR filter in accordance with the present invention, incorporating stages each of which is a Direct Form FIR filter of generic width.

FIG. 5 shows the hybrid Transpose/Direct Form FIR filter according to the invention, generalized to arbitrary $n_d$ and arbitrary $n_t$. In embodiment 50, each stage 51 is a FIR filter unit 52 of the Direct Form type, including an arbitrary number $n_d$ of multipliers 520. Similarly, sample chain 53 includes $n_d$ one-clock-cycle delays 530, and adder chain 54, used to add the results of the stages 51, includes delays 541 between adders 540, with each delay 541 being $n_d$ clock periods long.

It will be apparent that for $n_d=1$, the Transpose/Direct Form FIR filter according to the invention collapses to an ordinary Transpose Form FIR filter, while for $n_t=1$, the Transpose/Direct Form FIR filter according to the invention collapses to an ordinary Direct Form FIR filter.

Although the sample chain required for the Transpose/Direct Form FIR filter according to the invention is longer than that needed for any ordinary Transpose Form FIR filter, it is nevertheless shorter than that needed for a Direct Form FIR filter of arbitrary length, and is limited to a finite length of $n_d$. The hybrid structure maps well onto specialized processing blocks having a finite number of multipliers. In particular, for the case 40 of $n_d=4$, shown in FIG. 4, the hybrid structure maps well onto the aforementioned specialized processing blocks. But in any case, regardless of the particular type of specialized processing block, there will be a value of $n_d$ for which the hybrid structure maps well. Moreover, because of the delays inherent in adder chain 44/54, the adder chain can be split over several clock cycles, with minimal impact on resources even for large adders.

It is common in specialized multiplier blocks to include pipelining registers, e.g., before and after the multipliers, and between different adder stages. Those pipelining registers, if provided, can be counted towards the total number of delays ($z^{-n_d}$). This would lead to a more efficient implementation of the invention.

The hybrid Transpose/Direct Form FIR filter according to the invention can be used in different kinds of integrated circuit devices including, without limitation, application-specific integrated circuits and PLDs, and the invention includes the method of programming the hybrid Transpose/Direct Form FIR filter into the specialized multiplier block of a PLD. PLDs programmed in accordance with the invention may be used in many kinds of electronic devices. One possible use is in a data processing system that also may include one or more of the following components: a processor; memory; I/O circuitry; and peripheral devices. These components may be coupled together by a system bus and are populated on a circuit board which is contained in an end-user system.

The end user system can be used in a wide variety of applications, such as computer networking, data networking, instrumentation, video processing, digital signal processing, or any other application where the advantage of using programmable or reprogrammable logic is desirable. The PLD can be used to perform a variety of different logic functions. For example, the PLD can be configured as a processor or controller that works in cooperation with the main system processor. The PLD may also be used as an arbiter for arbitrating access to shared resources in the system. In yet another example, the PLD can be configured as an interface between the processor and one of the other components in the system.

Various technologies can be used to implement integrated circuit devices of the type described above, including PLDs that can be programmed according to this invention.

Instructions for carrying out the method according to this invention may be encoded on a machine-readable medium, to be executed by a suitable computer or similar device to implement the method of the invention for programming PLDs. For example, a personal computer may be equipped with an interface to which a PLD can be connected, and the personal computer can be used by a user to program the PLD using a suitable software tool, such as the QUARTUS® II software described above.

Figure 6:
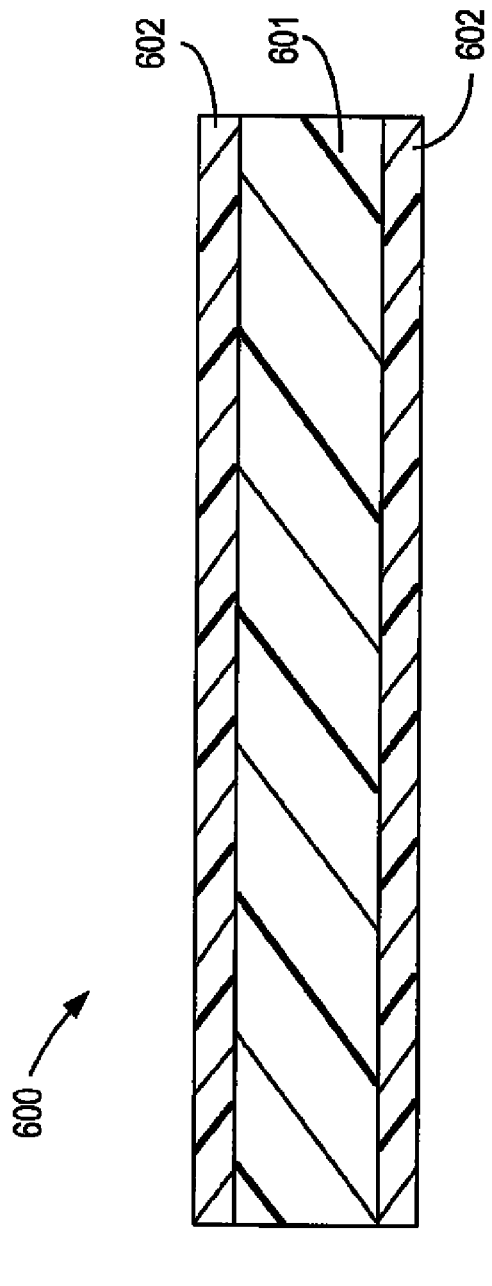
FIG. 6 is a cross-sectional view of a magnetic data storage medium encoded with a set of machine-executable instructions for performing the method according to the present invention.

FIG. 6 presents a cross section of a magnetic data storage medium 600 which can be encoded with a machine executable program that can be carried out by systems such as the aforementioned personal computer, or other computer or similar device. Medium 600 can be a floppy diskette or hard disk, or magnetic tape, having a suitable substrate 601, which may be conventional, and a suitable coating 602, which may be conventional, on one or both sides, containing magnetic domains (not visible) whose polarity or orientation can be altered magnetically. Except in the case where it is magnetic tape, medium 600 may also have an opening (not shown) for receiving the spindle of a disk drive or other data storage device.

The magnetic domains of coating 602 of medium 600 are polarized or oriented so as to encode, in manner which may be conventional, a machine-executable program, for execution by a programming system such as a personal computer or other computer or similar system, having a socket or peripheral attachment into which the PLD to be programmed may be inserted, to configure appropriate portions of the PLD, including its specialized processing blocks, if any, as a hybrid Transpose Form/Direct Form FIR filter in accordance with the invention.

Figure 7:
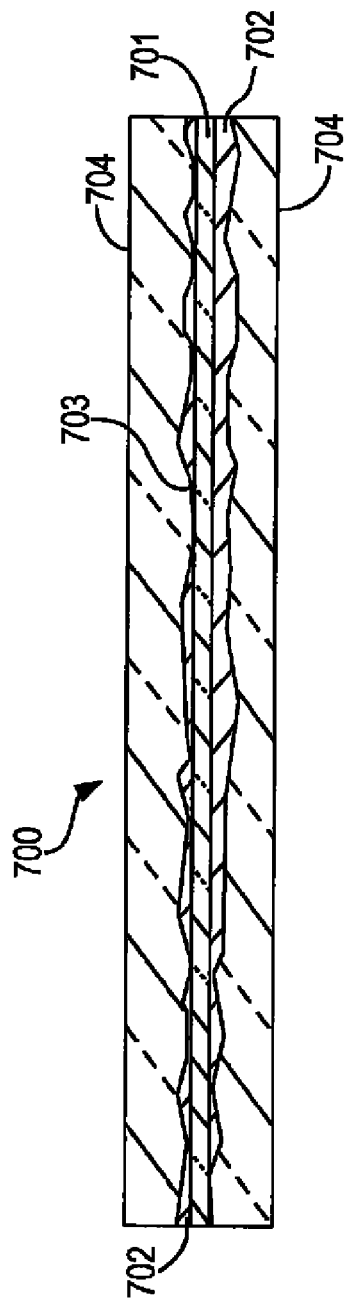
FIG. 7 is a cross-sectional view of an optically readable data storage medium encoded with a set of machine executable instructions for performing the method according to the present invention.

FIG. 7 shows a cross section of an optically-readable data storage medium 700 which also can be encoded with such a machine-executable program, which can be carried out by systems such as the aforementioned personal computer, or other computer or similar device. Medium 700 can be a conventional compact disk read only memory (CD-ROM) or digital video disk read only memory (DVD-ROM) or a rewriteable medium such as a CD-R, CD-RW, DVD-R, DVD-RW, DVD+R, DVD+RW, or DVD-RAM or a magneto-optical disk which is optically readable and magneto-optically rewriteable. Medium 700 preferably has a suitable substrate 701, which may be conventional, and a suitable coating 702, which may be conventional, usually on one or both sides of substrate 701.

In the case of a CD-based or DVD-based medium, as is well known, coating 702 is reflective and is impressed with a plurality of pits 703, arranged on one or more layers, to encode the machine-executable program. The arrangement of pits is read by reflecting laser light off the surface of coating 702. A protective coating 704, which preferably is substantially transparent, is provided on top of coating 702.

In the case of magneto-optical disk, as is well known, coating 702 has no pits 703, but has a plurality of magnetic domains whose polarity or orientation can be changed magnetically when heated above a certain temperature, as by a laser (not shown). The orientation of the domains can be read by measuring the polarization of laser light reflected from coating 702. The arrangement of the domains encodes the program as described above.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A programmable logic device configured as hybrid finite impulse response (FIR) filter circuitry; wherein:
    said programmable logic device has a plurality of specialized processing blocks each of which includes a plurality of multipliers and a single adder for simultaneously adding outputs of said multipliers; and
    said hybrid FIR filter circuitry comprises:
    a first number of said specialized processing blocks each of which is configured as a respective Direct Form FIR filter circuit in which each respective multiplier in said plurality of multipliers multiplies a respective sample by a respective coefficient and outputs of said respective multipliers are added simultaneously by said single adder to generate a Direct Form FIR output, said hybrid FIR filter circuitry having a second number of taps, each said Direct Form FIR filter circuit comprising a third number of taps, and said second number being a product of said first number and said third number;
    an adder chain comprising a plurality of additional adders, separate from any adder in said first number of said specialized processing blocks that adds said outputs of said respective multipliers, each of said additional adders having, as one input, one output of one of said respective Direct Form FIR filter circuits, and each of said additional adders other than a first of said additional adders having as one input an output of another one of said additional adders, said adder chain further comprising a respective output delay between (a) each said output of another one of said additional adders, that is an input to one of said additional adders other than a first one of said additional adders, and (b) said one of said additional adders other than a first one of said additional adders, and
    an input sample chain comprising a number of registers equal to said third number; wherein:
    each said register provides a sample substantially simultaneously to a corresponding input of each said Direct Form FIR filter circuit,
    said input sample chain shifts once at every clock cycle,
    each Direct Form FIR filter circuit generates an output at every said clock cycle, and
    each said respective output delay has a delay period of a number of said clock cycles equal to said third number.

2. The programmable logic device of claim 1 wherein:
    each said Direct Form FIR filter circuit comprises a number of multiplier circuits equal to said third number; and
    each said corresponding input comprises an input to a respective one of said multiplier circuits in each said Direct Form FIR filter circuit.

3. The programmable logic device of claim 2; wherein:
    said hybrid FIR filter circuitry further comprises a number of coefficients equal to said second number;
    said coefficients are divided into a number of groups equal to said first number;
    each said group comprises a number of coefficients equal to said third number; and
    each coefficient in each said group is input to a respective one of said multiplier circuits.

4. The programmable logic device of claim 1 wherein:
    each said Direct Form FIR filter circuit comprises a number of multiplier circuits equal to said third number;
    said hybrid FIR filter circuitry further comprises a number of coefficients equal to said second number;
    said coefficients are divided into a number of groups equal to said first number;
    each said group comprises a number of coefficients equal to said third number; and
    each coefficient in each said group is input to a respective one of said multiplier circuits.

5. A method of programmably configuring a programmable logic device as a hybrid finite impulse response (FIR) filter, said programmable logic device having a plurality of specialized processing blocks each of which includes a plurality of multipliers and a single adder for simultaneously adding outputs of said multipliers, said method comprising:
    programmably configuring each of a first number of said specialized processing blocks as a respective Direct Form FIR filter in which each respective multiplier in said plurality of multipliers multiplies a respective sample by a respective coefficient and outputs of said respective multipliers are added simultaneously by said single adder to generate a Direct Form FIR output, said hybrid FIR filter having a second number of taps, each said respective Direct Form FIR filter comprising a third number of taps, and said second number being a product of said first number and said third number;
    programmably configuring an adder chain from a plurality of additional adders, separate from any adder in said first number of said specialized processing blocks that adds said outputs of said respective multipliers, to add outputs of said Direct Form FIR filters, said adder chain comprising a respective delay preceding each of said additional adders in said adder chain, other than a first one of said additional adders in said adder chain, that has, as an input, one of said outputs of said Direct Form FIR filters;
    programmably configuring each said respective delay to have a delay period of a number of clock cycles equal to said third number; and
    programmably configuring an input sample chain comprising a number of registers equal to said third number; wherein:
    each said register provides a sample substantially simultaneously to a corresponding input of each said Direct Form FIR filter,
    said input sample chain shifts once at every clock cycle,
    each Direct Form FIR filter circuit generates an output at every said clock cycle, and said programmable logic device is configured as a hybrid FIR filter having a number of hybrid stages equal to said first number, each of said hybrid stages comprising a respective one of said Direct Form FIR filters.

6. The method of claim 5 wherein:
each said Direct Form FIR filter comprises a number of multipliers equal to said third number; and
each said corresponding input comprises an input to a respective one of said multipliers in each said Direct Form FIR filter.

7. The method of claim 6 wherein said hybrid FIR filter comprises a number of coefficients equal to said second number; said method further comprising:
programmably configuring a number of coefficient memories equal to said first number, each said coefficient memory storing a number of coefficients equal to said third number; and
programmably configuring each coefficient stored in each said memory as an input to a respective one of said multipliers.

8. The method of claim 5 wherein:
said programmably configuring each of a first number of said specialized processing blocks as a respective Direct Form FIR filter comprises programmably configuring each said Direct Form FIR filter to have a number of multipliers equal to said third number; and
said hybrid FIR filter further comprises a number of coefficients equal to said second number; said method further comprising:
programmably configuring a number of coefficient memories equal to said first number, each said coefficient memory storing a number of coefficients equal to said third number; and
programmably configuring each coefficient stored in each said memory as an input to a respective one of said multipliers.

9. A non-transitory data storage medium encoded with non-transitory machine-executable instructions for performing a method of programmably configuring a programmable logic device as a hybrid finite impulse response (FIR) filter, said programmable logic device having a plurality of specialized processing blocks each of which includes a plurality of multipliers and a single adder for simultaneously adding outputs of said multipliers, said instructions comprising:
instructions to programmably configure each of a first number of said specialized processing blocks as a respective Direct Form FIR filter in which each respective multiplier in said plurality of multipliers multiplies a respective sample by a respective coefficient and outputs of said respective multipliers are added simultaneously by said single adder to generate a Direct Form FIR output, said hybrid FIR filter having a second number of taps, said instructions to programmably configure each of said first number of said specialized processing blocks as said respective Direct Form FIR filter comprises instructions to programmably configure each said Direct Form FIR filter with a third number of taps, said second number being a product of said first number and said third number;
instructions to programmably configure an adder chain from a plurality of additional adders, separate from any adder in said first number of said specialized processing blocks that adds said outputs of said respective multipliers, to add outputs of said Direct Form FIR filters, said adder chain comprising a respective delay preceding each of said additional adders in said adder chain, other than a first one of said additional adders in said adder chain, that has as an input one of said Direct Form FIR filters;
instructions to programmably configure each said respective delay to have a delay period of a number of clock cycles equal to said third number; and
instructions to programmably configure an input sample chain comprising a number of registers equal to said third number; wherein:
each said register provides a sample substantially simultaneously to a corresponding input of each said Direct Form FIR filter,
said input sample chain shifts once at every clock cycle,
each Direct Form FIR filter circuit generates an output at every said clock cycle, and
said programmable logic device is configured as a hybrid FIR filter having a number of hybrid stages equal to said first number, each of said hybrid stages comprising a respective one of said Direct Form FIR filters.

10. The non-transitory data storage medium of claim 9 wherein said instructions further comprise:
instructions to configure each said Direct Form FIR filter with a number of multipliers equal to said third number; wherein:
each said corresponding input comprises an input to a respective one of said multipliers in each said Direct Form FIR filter.

11. The non-transitory data storage medium of claim 10 wherein said hybrid FIR filter comprises a number of coefficients equal to said second number; said instructions further comprising:
instructions to programmably configure a number of coefficient memories equal to said first number, each said coefficient memory storing a number of coefficients equal to said third number; and
instructions to programmably configure each coefficient stored in each said memory as an input to a respective one of said multipliers.

12. The non-transitory data storage medium of claim 9 wherein:
said instructions to programmably configure each of a first number of said specialized processing blocks as a respective Direct Form FIR filter comprise instructions to programmably configure each said Direct Form FIR filter to have a number of multipliers equal to said third number; and
said hybrid FIR filter further comprises a number of coefficients equal to said second number; said instructions further comprising:
instructions to programmably configure a number of coefficient memories equal to said first number, each said coefficient memory storing a number of coefficients equal to said third number; and
instructions to programmably configure each coefficient stored in each said memory as an input to a respective one of said multipliers.

* * * * *